United States Patent [19]
Tanaka et al.

[11] Patent Number: 5,552,374
[45] Date of Patent: Sep. 3, 1996

[54] OXIDE SUPERCONDUCTING A TRANSISTOR IN CRANK-SHAPED CONFIGURATION

[75] Inventors: So Tanaka; Michitomo IIyama, both of Osaka, Japan

[73] Assignee: Sumitomo Electric Industries, Ltd., Osaka, Japan

[21] Appl. No.: 221,966

[22] Filed: Apr. 4, 1994

Related U.S. Application Data

[63] Continuation-in-part of Ser. No. 44,623, Apr. 19, 1993, abandoned.

[30] Foreign Application Priority Data

Apr. 9, 1992 [JP] Japan .................................. 4-116946

[51] Int. Cl.$^6$ ............................. H01L 23/48; H01L 39/06; H01L 39/08; H01L 39/14
[52] U.S. Cl. ............................. 505/193; 505/234; 257/38; 257/39
[58] Field of Search .................... 257/38, 39; 505/193, 505/234, 701

[56] References Cited

U.S. PATENT DOCUMENTS

| | | | |
|---|---|---|---|
| 5,179,426 | 1/1993 | Iwamatsu | 257/39 |
| 5,236,896 | 8/1993 | Makamura et al. | 257/34 |
| 5,274,249 | 12/1993 | Xi et al. | 257/39 |

FOREIGN PATENT DOCUMENTS

| | | | |
|---|---|---|---|
| 2052379 | 3/1992 | Canada | 257/39 |
| 2052380 | 3/1992 | Canada | 257/39 |
| 0324044 | 7/1989 | European Pat. Off. | |
| A-0477103 | 3/1992 | European Pat. Off. | |
| A-0475838 | 3/1992 | European Pat. Off. | |
| 0477103 | 3/1992 | European Pat. Off. | 257/38 |
| 0478465 | 4/1992 | European Pat. Off. | 257/39 |
| 478463 | 4/1992 | European Pat. Off. | 257/39 |
| 478466 | 4/1992 | European Pat. Off. | 257/39 |
| A-0484252 | 5/1992 | European Pat. Off. | |
| 63-234572 | 9/1988 | Japan | 257/39 |
| 64-11376 | 1/1989 | Japan | |
| 2-192172 | 7/1990 | Japan | 257/39 |
| 0484232 | 5/1992 | Japan | 257/39 |
| 4-163976 | 6/1992 | Japan | 257/39 |

OTHER PUBLICATIONS

"Short–Channel Field–Effect Transistor", IBM Technical Disclose Bulletin, vol. 32, No. 3A, Aug. 1989, New York, US, pp. 77–78.

*Primary Examiner*—Sara W. Crane
*Assistant Examiner*—Alice W. Tang
*Attorney, Agent, or Firm*—Foley & Lardner

[57] ABSTRACT

A superconducting device comprises a thin superconducting channel formed of an oxide superconductor, a superconducting source region and a superconducting drain region formed of an oxide superconductor at the both ends of the superconducting channel which connects the superconducting source region and the superconducting drain region, so that superconducting current can flow through the superconducting channel between the superconducting source region and the superconducting drain region. The superconducting device further includes a gate electrode through a gate insulator on the superconducting channel for controlling the superconducting current flowing through the superconducting channel. The length of the gate electrode ranges from one third of the length of the superconducting channel to one and a half length of the superconducting channel.

9 Claims, 3 Drawing Sheets

5,552,374

OXIDE SUPERCONDUCTING A TRANSISTOR IN CRANK-SHAPED CONFIGURATION

This application is a continuation-in-part of Ser. No. 08/044,623 filed Apr. 9, 1993, now abandoned.

BACKGROUND OF THE INVENTION

1. Field of the Invention

The present invention relates to a superconducting device, and more specifically to a superconducting device having an extremely thin superconducting channel formed of oxide superconductor material.

2. Description of Related Art

Devices which utilize superconducting phenomena operate rapidly with low power consumption so that they have higher performance than conventional semiconductor devices. Particularly, by using an oxide superconductor material which has been recently advanced in study, it is possible to produce a superconducting device which operates at relatively high temperature.

A Josephson device is one of well-known superconducting devices. However, since the Josephson device is a two-terminal device, a logic gate which utilizes Josephson devices becomes complicated configuration. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to the superconducting proximity effect, and is controlled by an applied gate voltage. This type of the super-FET operates at a higher speed with a low power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short separation distance mentioned above.

On the other hand, the super-FET having the superconducting channel has a large current capability, and the fine processing which is required to product the first type of the super-FET is not needed to product this type of super-FET.

It is estimated that superconducting carriers (Cooper pairs) are forced in the direction away from the gate electrode, so that the space charge of a depletion layer in which there is no superconducting particle satisfy the neutrality condition with the charge between the gate electrode and the gate insulator, when a signal voltage is applied to the gate electrode of the super-FET having a superconducting channel. Since the carrier density of an oxide superconductor ranges $10^{20}$–$10^{21}$/cm$^3$, which is a medium value between that of a semiconductor and a metal, the depletion layer has a thickness of a few nanometers in case of a superconducting channel of an oxide superconductor and applied voltage of a few volts.

Therefore, in order to obtain a complete ON/OFF operation, the superconducting channel of an oxide superconductor should have an extremely thin thickness of a few nanometers. In addition, it is necessary to process the gate with high precision of sub-micrometers, which has a suitable length relative to its thickness.

However, in the super-FET, special attention is not given to the source-drain distance, namely the sum of the distance between the superconducting source region and the gate electrode and the distance between the gate electrode and the superconducting drain region. Since it has been considered that the critical current density of the superconducting channel is locally changed at a gate portion just under the gate electrode so that the gate portion becomes resistive, when a voltage is applied to the gate electrode. Other portions of the superconducting channel is considered to be superconducting regardless of the voltage which is applied to the gate electrode. Therefore, it is considered that they have no effect on the modulation of the current flowing through the superconducting channel, even if they are very long relative to the gate portion.

However, an oxide superconductor is a superconductor of the second kind so that flux penetrates into it under some conditions, while the oxide superconductor is in the superconducting state. A portion of the oxide superconductor at the center of the penetrating flux is in a normal conducting state and it is resistive. In addition, if large superconducting current flows through the superconducting channel of an oxide superconductor, since the flux migrates in the superconducting channel, a voltage is generated between the both ends of the superconducting channel.

In a super-FET of a prior art, as mentioned above, no attention is given to the distance between the superconducting source region and the gate electrode and the distance between the gate electrode and the superconducting drain region. Therefore, when the superconducting channel is resistive, a voltage applied to the gate electrode can change resistance of only the gate portion just under the gate electrode.

If the superconducting channel is very long relative to the gate portion, the change of the resistance of the gate portion becomes very small relative to the whole resistance of the superconducting channel. Therefore, in this case, even if large modulation is performed at the gate portion, little current modulation and little voltage modulation are observed between the both ends of the superconducting channel.

By this, the conventional super-FET does not have an enough performance. Summary of the Invention Accordingly, it is an object of the present invention to provide an FET type superconducting device having a superconducting region constituted of an extremely thin oxide superconductor film, which have overcome the above mentioned defects of the conventional ones.

The above and other objects of the present invention are achieved in accordance with the present invention by a superconducting device comprising a thin superconducting channel formed of an oxide superconductor, a superconducting source region and a superconducting drain region formed of an oxide superconductor at the both ends of the superconducting channel which connects the superconducting source region and the superconducting drain region, so that superconducting current can flow through the superconducting channel between the superconducting source region and the superconducting drain region, and a gate electrode through a gate insulator on the superconducting channel for controlling the superconducting current flowing through the superconducting channel, in which the length of the gate electrode ranges from one third of the length of the superconducting channel to one and a half length of the superconducting channel.

In the superconducting device in accordance with the present invention, if the gate electrode has an equal or longer length than that of the superconducting channel, the resistance of the superconducting channel is changed along its whole length when a voltage is applied to the gate electrode. By this, large modulation of both current and voltage of the superconducting channel and complete ON/OFF operation of the superconducting channel are realized.

In case that the gate electrode is shorter than the superconducting channel, only the resistance of the gate portion (the portion just under the gate electrode) of the superconducting channel is changed when a voltage is applied to the gate electrode. However, gate electrode of the super-FET in accordance with the present invention has a length not shorter than one third of that of the superconducting channel. Therefore, the change of resistance of the gate portion is very large compared to the whole resistance of the superconducting channel. Thus, large modulation of both current and voltage of the superconducting channel and complete ON/OFF operation of the superconducting channel are realized as the above-mentioned super-FET.

In the super-FET in accordance with the present invention, the superconducting channel, the superconducting source region and the superconducting drain region can be arranged arbitrarily, so long as the superconducting source region and the superconducting drain region is arranged separately from each other and the superconducting channel connects them.

In one preferred embodiment, the superconducting channel connects the top portions of the superconducting source region and the superconducting drain region and the superconducting channel, the superconducting source region and the superconducting drain region have a planar upper surface. This planar upper surface is desirable to form a gate electrode which is longer than the superconducting channel.

It is also preferable that the superconducting channel connects the middle portions of the superconducting source region and the superconducting drain region and the gate electrode and the gate insulator are bent along the upper surface of the superconducting channel, the superconducting source region and the superconducting drain region. In this type of the super-FET, superconducting current flows into or flows from the superconducting channel efficiently so that the current capability of the super-FET can be improved.

In another preferred embodiment, the superconducting channel connects the bottom portions of the superconducting source region and the superconducting drain region and the gate electrode and the gate insulator are arranged on the superconducting channel between the superconducting source region and the superconducting drain region. The super-FET preferably includes an insulating layer which surrounds side surfaces of the gate electrode and which isolates the gate electrode from the superconducting source region and the superconducting drain region. In this case, the super-FET has a substantially planar upper surface. This planar upper surface is favorable for forming conductor wirings in a later process.

In the super-FET in accordance with the present invention, the superconducting channel preferably connects the top portions of the superconducting source region and the superconducting drain region and the gate electrode is arranged under the superconducting channel through the gate insulating layer between the superconducting source region and the superconducting drain region. The super-FET also has a planar upper surface which is favorable for forming conductor wirings in a later process.

In still another preferred embodiment, the superconducting source region and the superconducting drain region are placed in staggered fashion, and the superconducting channel connects the superconducting source region and the superconducting drain region so that the superconducting source region, the superconducting channel and the superconducting drain region are arranged to form a crank in the named order. In this type of the super-FET, the gate insulator is successively formed on the upper surface of the superconducting source region, on the side surface of the superconducting channel and on the upper surface of the superconducting drain region, and the gate electrode is formed on an adjoining side of the superconducting channel through the gate insulator.

In a preferred embodiment, the oxide superconductor is formed of high $T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if silicon is used as a substrate.

Preferably, the superconducting channel is formed of a c-axis oriented oxide superconductor thin film and the superconducting source region and the superconducting drain region are formed of a-axis oriented oxide superconductor thin films.

The above and other objects, features and advantages of the present invention will be apparent from the following

DESCRIPTION OF THE PREFERRED EMBODIMENTS

Embodiment 1

Figure 1:
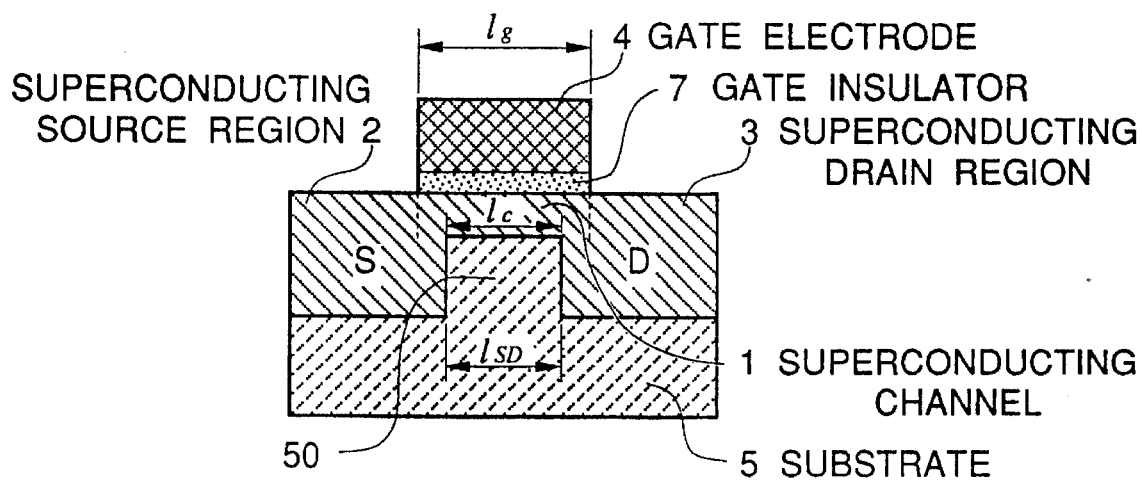
FIG. 1 shows a diagrammatic sectional view of a first embodiment of a super-FET according to the present invention, in which the length of the gate electrode $l_g$ is longer than the length $l_c$ of the superconducting channel, and in which top portions of the superconducting source and drain are connected to the channel.

FIG. 1 shows a diagrammatic sectional view of an embodiment of the super-FET in accordance with the present invention. The super-FET includes a superconducting source region 2 and a superconducting drain region 3 of an oxide superconductor, and a thin superconducting region 1 of the oxide superconductor, which connects the top portions of the superconducting source region 2 and the superconducting drain region 3. The superconducting source region 2, the superconducting drain region 3 and the superconducting region 1 are arranged on a substrate 5 having a projecting insulator region 50 on its center portion. The super-FET further includes a gate insulator 7 on the superconducting region 1 and a gate electrode 4 on the gate insulator 7. The superconducting region 1, the superconducting source region 2 and the superconducting drain region 3 of the super-FET have a planar upper surface. This planar upper surface is desirable to form a long gate electrode 4.

The gate electrode has a longer length of $l_g$ than the length $l_c$ of the superconducting channel and a length $l_{SD}$ of a portion having an equal thickness to that of the superconducting channel between the superconducting source region and the superconducting drain region. Therefore, the resistance of the superconducting channel is changed along its whole length, when a voltage is applied to the gate electrode. By this, large modulation of both current and voltage of the superconducting channel and complete ON/OFF operation of the superconducting channel are realized.

The length $l_{SD}$ of the portion having an equal thickness to that of the superconducting channel between the superconducting source region and the superconducting drain region preferably ranges from 100 to 1000 nanometers. The length $l_{SD}$ is determined by fine processing capability and epitaxial growth ability between the superconducting source region and the superconducting drain region. As mentioned above, the gate electrode is longer than the length $l_{SD}$. The length $l_g$ of the gate electrode preferably ranges from 100 to 1500 nanometers and not longer than one and a half length of the length $l_{SD}$. In this case, the length $l_{SD}$ between the superconducting source region and the superconducting drain region is the same as the length $l_c$ of the superconducting channel. In accordance with the present invention, the length $l_{SD}$ should be equal to or shorter than twice of $l_c$.

If the gate electrode is too long, the gate electrode has a too large capacity and the overlaps between the gate electrode and the superconducting source region and between the gate electrode and the superconducting drain region generate parasitic capacities. These capacities inhibit the rapid operation. The parasitic capacities also make the characteristics poor and result in inferior performance.

In addition, if the length $l_{SD}$ is too long, the portion also has parasitic capacities which degrade properties of the super-FET.

On the other hand, the superconducting channel has a thickness of several nanometers, preferably less than five nanometers. This extremely thin superconducting channel is necessary for complete ON/OFF operation.

The gate insulator should have a thickness more than ten nanometers which is sufficient to prevent a tunnel current. However, if the gate insulator is too thick, the applied gate voltage is absorbed by the gate capacity and little electric field is generated in the superconducting channel. Therefore, the required voltage which controls the current of the superconducting channel becomes too high so that it is difficult to control the current of the superconducting channel by the voltage applied to the gate electrode. Therefore, the gate insulator preferably has a thickness of 10 to 100 nanometers.

The superconducting source region and the superconducting drain region have a sufficient thickness for forming contacts on them, for example several hundreds nanometers.

It is preferable that the superconducting channel, superconducting source region and superconducting drain region of the super-FET of the present invention is formed of for example $Y_1Ba_2Cu_3O_{7-\delta}$ oxide superconductor material. In this connection, these superconducting regions are preferably formed of not only $Y_1Ba_2Cu_3O_{7-\delta}$ oxide superconductor material but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material. These oxide superconductor have a carrier density of $10^{20}-10^{21}/cm^3$.

The oxide superconductor has a large current density in the direction perpendicular to c-axis of its crystal. Therefore, the superconducting channel is preferably formed of a c-axis orientated oxide superconductor thin film, through which large superconducting current can flow in the direction parallel to its surface. In addition, the superconducting source region and the superconducting drain region are preferably formed of an a-axis orientated oxide superconductor thin film, through which large superconducting current can flow in the direction perpendicular to its surface.

The substrate 5 on which the super-FET of the present invention is manufactured is preferably formed of an insulating substrate, preferably an oxide single crystalline substrate such as MgO, $SrTiO_3$, $CdNdAlO_4$, YSZ, etc. These substrate materials are very effective in forming or growing a crystalline film having a high degree of crystalline orientation. However, the super-FET can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if silicon is used as a substrate.

The above super-FET can be manufactured by the following process. At first, an oxide superconductor thin film of, for example $Y_1Ba_2Cu_3O_{7-x}$ having a thickness of on the order of 300 nanometers is deposited on a substrate 5 such as a $SrTiO_3$ (100) substrate. The thickness of the oxide superconductor thin film should be enough large to form a contact on its surface. The oxide superconductor thin film can be deposited by a known method such as various sputterings, MBE, CVD, reactive co-evaporation.

Then, ions such as Ga ions are implanted by using a focused ion beam apparatus to a center portion of the oxide superconductor thin film so as to form an insulator region 50 which divides the oxide superconductor thin film into a superconducting source region 2 and a superconducting drain region 3.

It is also possible that a center portion of the oxide superconductor thin film is etched and removed so that the oxide superconductor thin film is divided into a superconducting source region 2 and a superconducting drain region 3. In this case, an insulator layer of, for example $SrTiO_3$, MgO or silicon nitride is formed so as to fill a hollow between the superconducting source region 2 and the superconducting drain region 3. This insulator layer becomes an insulator region 50.

Then, an oxide superconductor thin film of, for example $Y_1Ba_2Cu_3O_{7-x}$ having an extremely small thickness of on the order of 5 nanometers is deposited on the insulator region 50, the superconducting source region 2 and the superconducting drain region 3. A portion of this extremely thin oxide superconductor thin film on the insulator region 50 becomes a superconducting region 1. It is preferable that the superconducting region 1 is formed of a c-axis orientated oxide superconductor thin film. Since, oxide superconductors have the largest critical current density in a direction perpendicular to c-axes of their crystal lattices.

A gate insulating layer 7 of, for example $SrTiO_3$, MgO or silicon nitride is formed on the superconducting region 1 and a gate electrode 4 is formed of a noble metal such as Au on the gate insulating layer 7 so that the super-FET in accordance with the present invention is completed.

Embodiment 2

Figure 2:
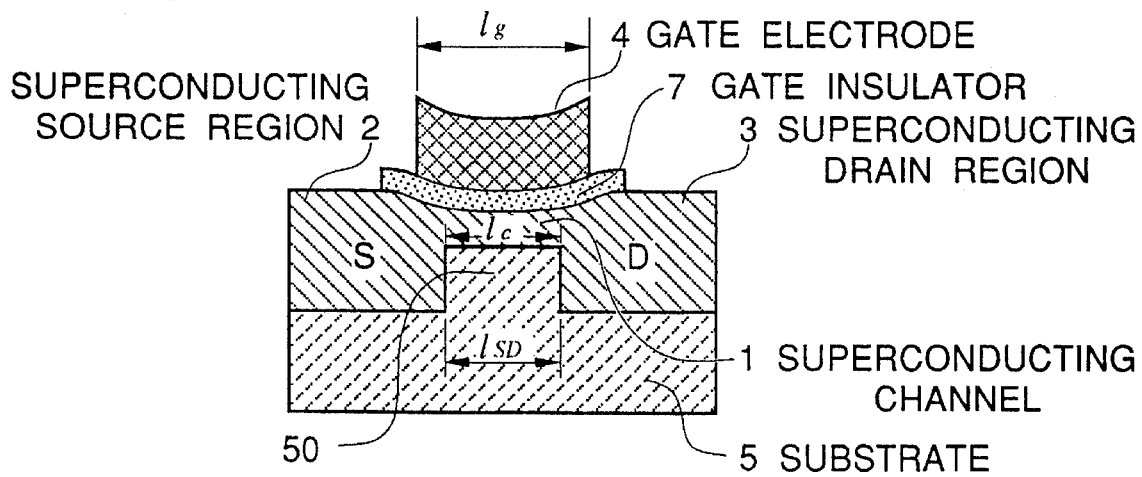
FIG. 2 shows a diagrammatic sectional view of a second embodiment of a super-FET according to the present invention that is similar to that shown in FIG. 1, but in which middle portions of the superconducting source and drain are connected to the channel.

FIG. 2 shows a diagrammatic sectional view of another embodiment of the super-FET in accordance with the present invention. This super-FET has almost the same structure as that of the super-FET of Embodiment 1. The difference between the super-FETs that the upper surface of the superconducting region 1 of the super-FET shown in FIG. 2 is arranged at a lower position than those of the superconducting source region 2 and the superconducting drain region 3 so that the superconducting region 1 connects the middle portions of the superconducting source region 2 and the superconducting drain region 3. And therefore, the gate electrode 4 and the gate insulator 7 are bent along the upper surface of the superconducting region 1, the superconducting source region 2 and the superconducting drain region 3. The superconducting source region 2, the superconducting drain region 3 and the superconducting region 1 are arranged on an appropriate substrate 5 having an insulator region 50.

In this type of the super-FET, superconducting current flows into or flows from the superconducting channel efficiently so that the current capability of the super-FET can be improved.

Other structure of the super-FET of this embodiment is the same as that of the super-FET of Embodiment 1. Namely, the length $l_{SD}$ of a portion having the same thickness as that of the superconducting channel preferably ranges from 100 to 1000 nanometers. The length $l_{SD}$ is determined by fine processing capability and epitaxial growth ability between the superconducting source region and the superconducting drain region. As mentioned above, the gate electrode is longer than the length $l_{SD}$. The length $l_g$ of the gate electrode preferably ranges from 100 to 1500 nanometers and not longer than one and a half length of the length $l_{SD}$. In this case, the length $l_{SD}$ between the superconducting source region and the superconducting drain region is the same as the length $l_c$ of the superconducting channel.

The super-FET of this Embodiment can be manufactured by almost the same process as that of Embodiment 1. Namely, an oxide superconductor thin film having a thickness of a few hundreds nanometers is formed on a substrate. A center portion of the oxide superconductor thin film is etched and removed so that it is divided into a superconducting source region 2 and a superconducting drain region 3.

An insulator layer is formed so as to fill a hollow between the superconducting source region 2 and the superconducting drain region 3 and to have a smoothly concave surface. This insulator layer becomes an insulator region 50. An oxide superconductor thin film having an extremely small thickness of on the order of 5 nanometers is deposited on the insulator region 50, the superconducting source region 2 and the superconducting drain region 3. A portion of this extremely thin oxide superconductor thin film on the insulator region 50 becomes a superconducting region 1.

A gate insulating layer 7 is formed on the superconducting region 1 and a gate electrode 4 is formed on the gate insulating layer 7 so that the super-FET in accordance with the present invention is completed.

Embodiment 3

Figure 3:
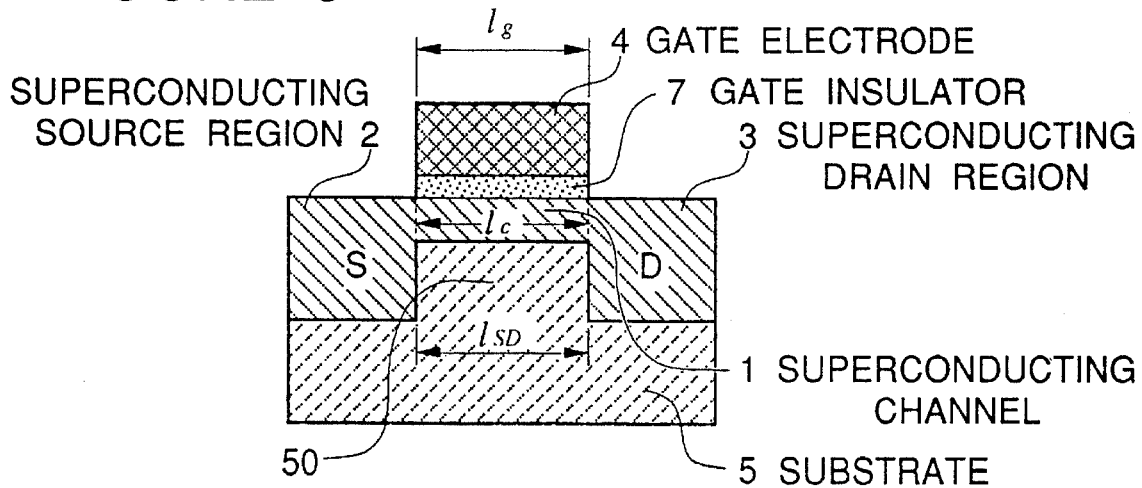
FIG. 3 shows a diagrammatic sectional view of a third embodiment of a super-FET according to the present invention, in which the length of the gate electrode $l_g$ is almost the same as the length $l_c$ of the superconducting channel and in which top portions of the superconducting source and drain are connected to the channel.

FIG. 3 shows a diagrammatic sectional view of still another embodiment of the super-FET in accordance with the present invention. This super-FET also has a similar structure to that of the super-FET of Embodiment 1. The superconducting region 1, the superconducting source region 2 and the superconducting drain region 3 of this super-FET has a planar upper surface as the super-FET shown in FIG. 1. The superconducting source region 2, the superconducting drain region 3 and the superconducting region 1 are arranged on an appropriate substrate 5 having an insulator region 50.

The gate electrode has almost the same length of $l_g$ as the length of a portion having an equal thickness to that of the superconducting channel between the superconducting source region and the superconducting drain region and the length $l_c$ of the superconducting channel. The resistance of the superconducting channel is changed along the whole length $l_{SD}$ of the same thickness portion, when a voltage is applied to the gate electrode. By this, large modulation of both current and voltage of the superconducting channel and complete ON/OFF operation of the superconducting channel are realized as the super-FET shown in FIG. 1.

The length $l_{SD}$ of the same thickness portion as the superconducting channel preferably ranges from 100 to 1000 nanometers. The length $l_{SD}$ is determined by fine processing capability and epitaxial growth ability between the superconducting source region and the superconducting drain region. As mentioned above, the gate electrode is as long as the length $l_{SD}$ between the superconducting source region and the superconducting drain region is the same as the length $l_c$ of the superconducting channel.

Of course, the superconducting region 1 can be arranged at a lower position, as the super-FET shown in FIG. 2, in this case. Namely, the super-FET may have a superconducting channel of which the upper surface is lower than those of the superconducting source region and the superconducting drain region so that it connects the middle portions of the superconducting source region 2 and the superconducting drain region 3, and the gate electrode 4, which has almost same length as that of the superconducting channel, and the gate insulator 7 are bent along the upper surface of the superconducting channel, the superconducting source region and the superconducting drain region.

In this type of the super-FET, superconducting current flows into or flows from the superconducting channel efficiently so that the current capability of the super-FET can be improved.

The super-FET of this Embodiment can be manufactured by almost the same process as that of Embodiment 1. Therefore, explanations of the process is abbreviated.

Embodiment 4

Figure 4:
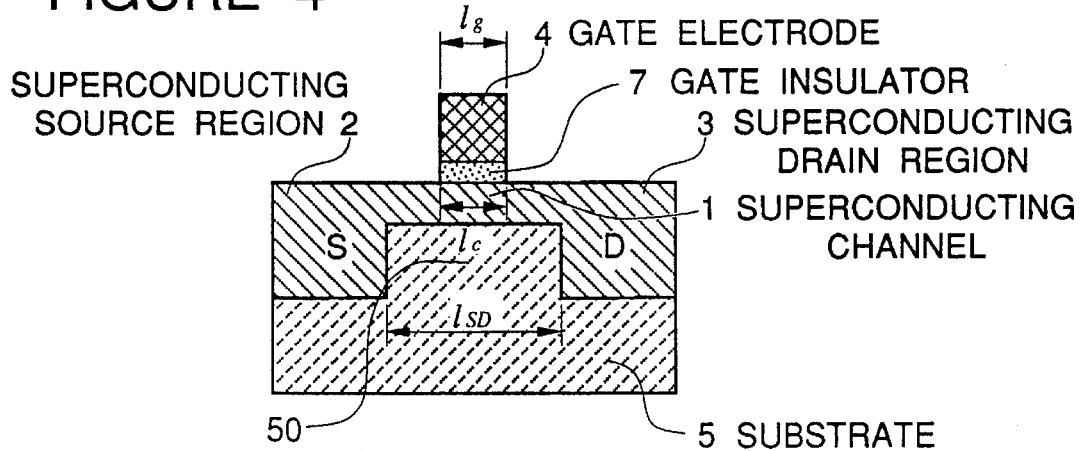
FIG. 4 shows a diagrammatic sectional view of a fourth embodiment of a super-FET according to the present invention, in which the length of the gate electrode $l_g$ is longer than a half of the length $l_{SD}$ and shorter than the length $l_{SD}$, and in which top portions of the superconducting source and drain are connected to the channel.

FIG. 4 shows a diagrammatic sectional view of still another embodiment of the super-FET in accordance with the present invention. This super-FET also has a similar structure to that of the super-FET of Embodiment 1. The superconducting region 1, the superconducting source region 2 and the superconducting drain region 3 of this super-FET has a planar upper surface as the super-FET shown in FIG. 1. The superconducting source region 2, the superconducting drain region 3 and the superconducting channel 1 are arranged on an appropriate substrate 5 having an insulator region 50.

The gate electrode has a length of $l_g$ which is longer than a half of the length $l_{SD}$ of a portion having an equal thickness to that of the superconducting channel between the superconducting source region and the superconducting drain region and shorter than the length $l_{SD}$. In this case, the length $l_c$ of the superconducting channel becomes equal to the length $l_g$ of the gate electrode. In this type of the super-FET, unlike the super-FETs shown in FIGS. 1 to 3, only the resistance of the superconducting channel (the portion just under the gate electrode) is changed, when a voltage is applied to the gate electrode. However, this change of resistance of the superconducting channel is very large compared to the whole resistance of the portion having an equal thickness to that of the superconducting channel between the superconducting source region and the superconducting drain region. Therefore, large modulation of both current and voltage of the superconducting channel and complete ON/OFF operation of the superconducting channel are realized as the super-FET shown in FIG. 1.

The length $l_{SD}$ of a portion having the same thickness as that of the superconducting channel preferably ranges from 100 to 1000 nanometers. The length $l_{SD}$ is determined by fine processing capability and epitaxial growth ability between the superconducting source region and the superconducting drain region. As mentioned above, the gate electrode is shorter than the length $l_{SD}$. The length $l_g$ of the gate electrode preferably ranges from 50 to 1000 nanometers and not shorter than a half of the length $l_{SD}$ and not longer than the length $l_{SD}$.

Of course, the superconducting region 1 can be arranged at a lower position, as the super-FET shown in FIG. 2 in this case. Namely, the super-FET may have a superconducting channel of which the upper surface is lower than those of the superconducting source region and the superconducting drain region so that it connects the middle portions of the superconducting source region 2 and the superconducting drain region 3, and the gate electrode 4, which is shorter than superconducting channel, and the gate insulator 7 are bent along the upper surface of the superconducting channel, the superconducting source region and the superconducting drain region.

In this type of the super-FET, superconducting current flows into or flows from the superconducting channel efficiently so that the current capability of the super-FET can be improved.

The super-FET of this Embodiment can be manufactured by almost the same process as that of Embodiment 1. Therefore, explanations of the process is abbreviated.

Embodiment 5

Figure 5:
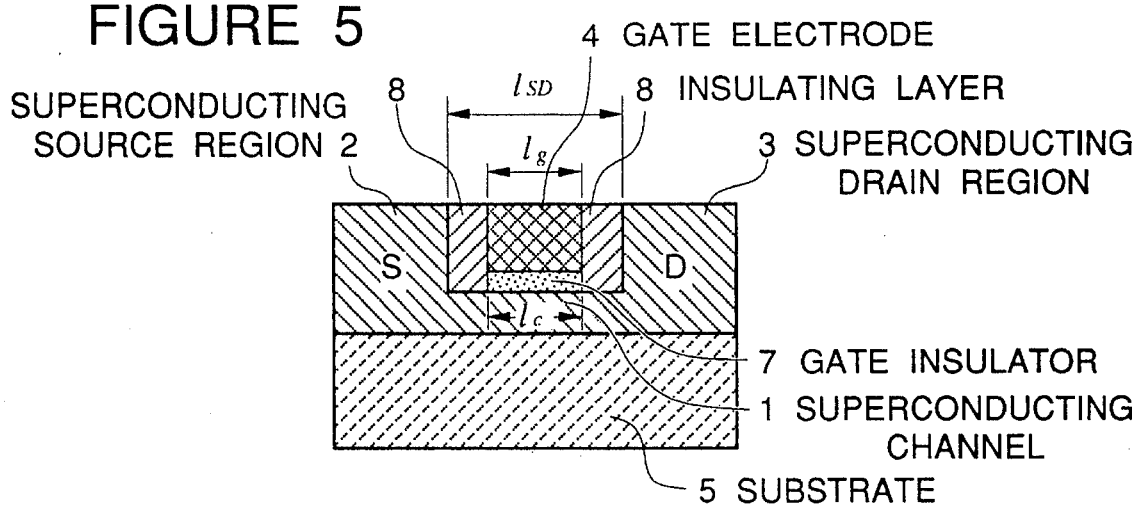
FIG. 5 shows a diagrammatic sectional view of a fifth embodiment of a super-FET according to the present invention, in which the length of the gate electrode $l_g$ is longer than one-half the length $l_c$ of the superconducting channel and in which bottom portions of the superconducting source and drain are connected to the channel.

FIG. 5 shows a diagrammatic sectional view of still another embodiment of the super-FET in accordance with the present invention. The super-FET includes a superconducting source region 2 and a superconducting drain region 3 of an oxide superconductor, and a thin superconducting region 1 of the oxide superconductor, which connects the bottom portions of the superconducting source region 2 and the superconducting drain region 3. The superconducting source region 2, the superconducting drain region 3 and the superconducting region 1 are arranged on a substrate 5. The super-FET further includes a gate insulator 7 on the superconducting region 1, a gate electrode 4 on the gate insulator 7 between the superconducting source region 2 and the superconducting drain region 3 and an insulating layer 8 which surrounds side surfaces of the gate electrode 4 and which isolates the gate electrode 4 from the superconducting source region 2 and the superconducting drain region 3.

The super-FET has a substantially planar upper surface. This planar upper surface is favorable for forming conductor wirings in a later process.

The gate electrode has a length of $l_g$ which is longer than a half of the length $l_{SD}$ of a portion having an equal thickness to that of the superconducting channel between the superconducting source region and the superconducting drain region. In this case, the length $l_c$ of the superconducting channel becomes equal to the length $l_g$ of the gate electrode. In this type of the super-FET, unlike the super-FETs shown in FIGS. 1 to 3, when a voltage is applied to the gate electrode, only the resistance of the superconducting channel (the portion just under the gate electrode) is changed. However, the change of resistance of the superconducting channel is very large compared to the whole resistance of the portion having an equal thickness to that of the superconducting channel between the superconducting source region and the superconducting drain region. Therefore, large modulation of both current and voltage of the superconducting channel and complete ON/OFF operation of the superconducting channel are realized as the super-FET shown in FIG. 1.

The length $l_{SD}$ of a portion having the same thickness as that of the superconducting channel preferably ranges from 100 to 1000 nanometers. The length $l_{SD}$ is determined by fine processing capability and epitaxial growth ability between the superconducting source region and the superconducting drain region. As mentioned above, the gate electrode is longer than a half of the length $l_{SD}$. The length $l_g$ of the gate electrode preferably ranges from 60 to 900 nanometers and longer than a half of the length $l_{SD}$ and should be shorter than the length $l_{SD}$ due to the specified structure of the super-FET of this Embodiment.

Other structure of the super-FET is almost the same as that of the super-FET of Embodiment 1.

The above super-FET can be manufactured by the following process. At first, an oxide superconductor thin film of, for example $Y_1Ba_2Cu_3O_{7-x}$ having an extremely small thickness of on the order of 5 nanometers is deposited on a substrate 5 such as a $SrTiO_3$ (100) substrate. A gate insulating layer 7 of, for example $SrTiO_3$, MgO or silicon nitride is formed on the extremely thin oxide superconductor thin film and a gate electrode 4 is formed of a noble metal such as Au on the gate insulating layer 7. In addition, an insulating layer 8 of for example silicon nitride is formed around the gate electrode 4.

An oxide superconductor thin film of, for example $Y_1Ba_2Cu_3O_{7-x}$ having a thickness of on the order of 300 nanometers is deposited over the whole. The thickness of the oxide superconductor thin film should be enough large to form a contact on its surface. The oxide superconductor thin film can be deposited by a known method such as various sputterings, MBE, CVD, reactive co-evaporation.

Then, unnecessary portion of the oxide superconductor thin film is etched and removed so that the oxide superconductor thin film is divided into a superconducting source region 2 and a superconducting drain region 3. By this, the super-FET in accordance with the present invention is completed.

Embodiment 6

Figure 6:
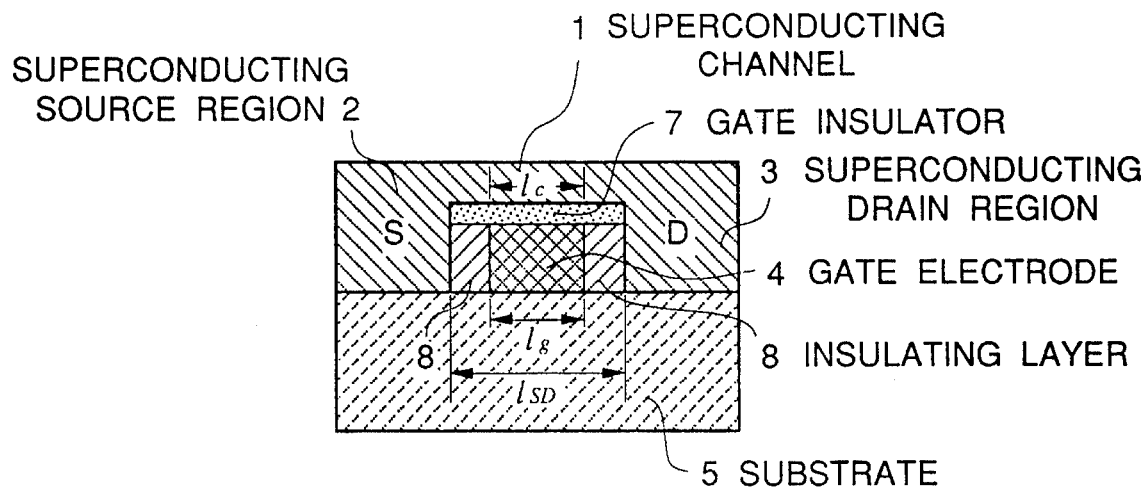
FIG. 6 shows a diagrammatic sectional view of a sixth embodiment of a super-FET according to the present invention, in which the length of the gate electrode $l_g$ is equal to the length lc of the superconducting channel and is longer than a half the length $l_{SD}$, and in which top portions of the superconducting source and drain are connected to the channel.

FIG. 6 shows a diagrammatic sectional view of still another embodiment of the super-FET in accordance with the present invention. The super-FET includes a superconducting source region 2 and a superconducting drain region 3 of an oxide superconductor, and a thin superconducting region 1 of the oxide superconductor, which connects the top portions of the superconducting source region 2 and the superconducting drain region 3. The super-FET further includes a gate insulator 7 under the superconducting region 1, a gate electrode 4 under the gate insulator 7 between the superconducting source region 2 and the superconducting drain region 3, and an insulating layer 8 which surrounds side surfaces of the gate electrode 4 and which isolates the gate electrode 4 from the superconducting source region 2 and the superconducting drain region 3. The gate insulator 7 contacts with the superconducting region 1 from the underside and the gate electrode 4 also contacts with the gate insulator 7 from the underside. The superconducting source region 2, the superconducting drain region 3 and the gate electrode 4 are arranged on a substrate 5.

The super-FET has a substantially planar upper surface. This planar upper surface is favorable for forming conductor wirings in a later process.

The gate electrode has a length of $l_g$ which is longer than a half of the length $l_{SD}$ of a portion having an equal thickness to that of the superconducting channel between the superconducting source region and the superconducting drain region. In this case, the length $l_c$ of the superconducting channel becomes equal to the length $l_g$ of the gate electrode. In this type of the super-FET, unlike the super-FETs shown in FIGS. 1 to 3, when a voltage is applied to the gate electrode, only the resistance of the superconducting channel (the portion just under the gate electrode) is changed. However, the change of resistance of the superconducting channel is very large compared to the whole resistance of the portion having an equal thickness to that of the superconducting channel between the superconducting source region and the superconducting drain region. Therefore, large modulation of both current and voltage of the superconducting channel and complete ON/OFF operation of the superconducting channel are realized as the super-FET shown in FIG. 1.

The length $l_{SD}$ of a portion having the same thickness as that of the superconducting channel preferably ranges from 100 to 1000 nanometers. The length $l_{SD}$ is determined by fine processing capability and epitaxial growth ability between the superconducting source region and the superconducting drain region. As mentioned above, the gate electrode is longer than a half of the length $l_{SD}$. The length $l_g$ of the gate electrode preferably ranges from 60 to 900 nanometers and longer than a half of the length $l_{SD}$ and should be shorter than the length $l_{SD}$ due to the specified structure of the super-FET of this Embodiment.

Other structure of the super-FET is almost the same as that of the super-FET of Embodiment 1.

The above super-FET can be manufactured by the following process. At first, an oxide superconductor thin film of, for example $Y_1Ba_2Cu_3O_{7-x}$ having a thickness of on the order of 300 nanometers is deposited on a substrate 5 such as a $SrTiO_3$ (100) substrate. The thickness of the oxide superconductor thin film should be enough large to form a contact on its surface.

Then, ions such as Ga ions are implanted by using a focused ion beam apparatus to a center portion of the oxide superconductor thin film so as to form an insulator region 8 which divides the oxide superconductor thin film into a superconducting source region 2, a superconducting drain region 3 and a gate electrode 4. It is also possible that the oxide superconductor of the gate electrode 4 is converted into a semiconductor by ion implantation.

A gate insulating layer 7 of, for example SrTiO$_3$, MgO or silicon nitride is formed on the gate electrode 4 and an oxide superconductor thin film of, for example Y$_1$Ba$_2$Cu$_3$O$_{7-x}$ having an extremely small thickness of on the order of 5 nanometers is deposited on the gate insulating layer 7, the superconducting source region 2 and the superconducting drain region 3 so that the super-FET in accordance with the present invention is completed. A portion of this extremely thin oxide superconductor thin film on the gate insulating layer 7 becomes a superconducting region 1. It is preferable that the superconducting region 1 is formed of a c-axis orientated oxide superconductor thin film. Since, oxide superconductors have the largest critical current density in a direction perpendicular to c-axes of their crystal lattices.

Embodiment 7

Figure 7:
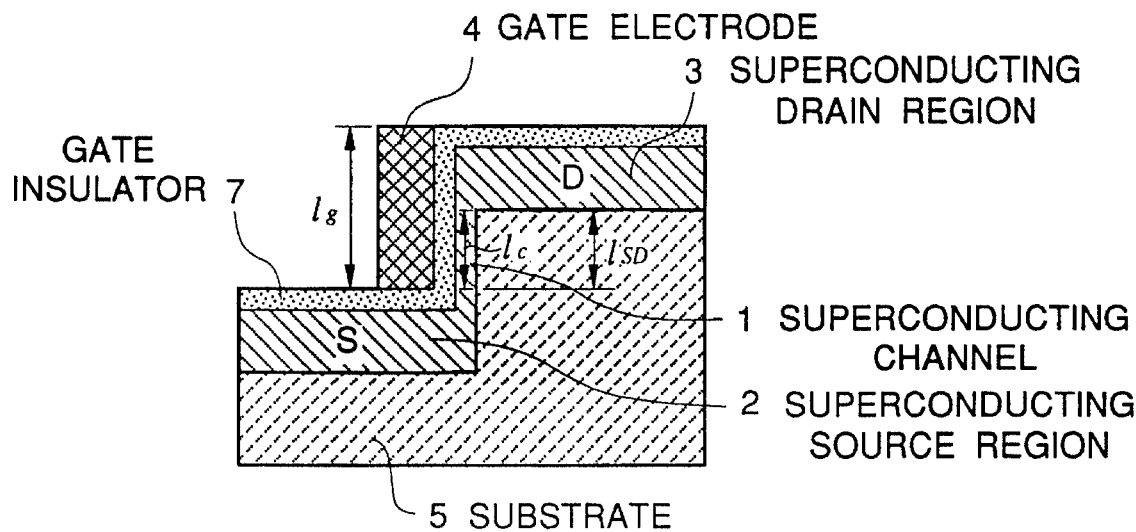
FIG. 7 shows a diagrammatic sectional view of a seventh embodiment of a super-FET according to the present invention, in which the superconducting drain, the superconducting channel and superconducting source are arrange to form a crank-shaped structure, in which the length of the gate electrode $l_g$ is longer than the length of the superconducting channel.

FIG. 7 shows a diagrammatic sectional view of still another embodiment of the super-FET in accordance with the present invention. The super-FET includes a superconducting source region 2 and a superconducting drain region 3 of an oxide superconductor, which are placed in staggered fashion, and a thin superconducting region 1 of the oxide superconductor which connects the superconducting source region 2 and the superconducting drain region 3. The superconducting source region 2, the superconducting region 1 and the superconducting drain region 3 are arranged to form a crank in the named order. The super-FET further includes a gate insulator 7 which is successively formed on the upper surface of the superconducting source region 2, on the side surface of the superconducting region 1 and on the upper surface of the superconducting drain region 3, and a gate electrode 4 which is formed on a portion of the gate insulator 7 along the superconducting region 1. The superconducting source region 2 and the superconducting drain region 3 are arranged on a step portion of a substrate 5.

The super-FET of this type has a smaller occupied area than super-FETs of other types. Additionally, the super-FET is easily associated with a multi-layer current path. Therefore, the super-FET is favorable for increasing integration.

In the super-FET, the length of the superconducting channel 1 is determined by thichknesses of the thin films which constitutes the superconducting source region 2 and the superconducting drain region 3. Therefore, the super-FET which has an extremely short superconducting channel is easily manufactured with good repeatability by employing the above structure.

The superconducting region 1, the superconducting source region 2 and the superconducting drain region 3 of the super-FET are preferably constituted of oxide superconductor thin films which have the largest critical current densities in the direction in which the superconducting current flows. In this connection, if the superconducting region 1, the superconducting source region 2 and the superconducting drain region 3 are constituted of c-axis orientated oxide superconductor thin films, they have the largest critical current densities in the direction in which the superconducting current flows. In addition, no grain boundary is generated between the superconducting region 1 and the superconducting source region 2 and between the superconducting region 1 and the superconducting drain region 3. Therefore, the super-FET of this embodiment has a high performance.

The gate electrode has a length of $l_g$ which is longer than the length $l_{SD}$ of a portion having an equal thickness to that of the superconducting channel between the superconducting source region and the superconducting drain region. In this case, the length $l_c$ of the superconducting channel becomes equal to the length $l_{SD}$. In this type of the super-FET, as the super-FETs shown in FIGS. 1 to 3, the resistance of the superconducting channel is changed along its whole length, when a voltage is applied to the gate electrode. By this, large modulation of both current and voltage of the superconducting channel and complete ON/OFF operation of the superconducting channel are realized.

The gate electrode has a longer length of $l_g$ than the length $l_c$ of the superconducting channel and a length $l_{SD}$ of a portion having an equal thickness to that of the superconducting channel between the superconducting source region and the superconducting drain region. Therefore, the resistance of the superconducting channel is changed along its whole length, when a voltage is applied to the gate electrode. By this, large modulation of both current and voltage of the superconducting channel and complete ON/OFF operation of the superconducting channel are realized.

The length $l_{SD}$ of the portion having an equal thickness to that of the superconducting channel between the superconducting source region and the superconducting drain region preferably ranges from 100 to 1000 nanometers. The length $l_{SD}$ is determined by fine processing capability and epitaxial growth ability between the superconducting source region and the superconducting drain region. As mentioned above, the gate electrode is longer than the length $l_{SD}$. The length lg of the gate electrode preferably ranges from 100 to 1500 nanometers and not longer than one and a half length of the length $l_{SD}$. In this case, the length $l_{SD}$ between the superconducting source region and the superconducting drain region is the same as the length $l_c$ of the superconducting channel.

Other structure of the super-FET is almost the same as that of the super-FET of Embodiment 1.

Figure 8:
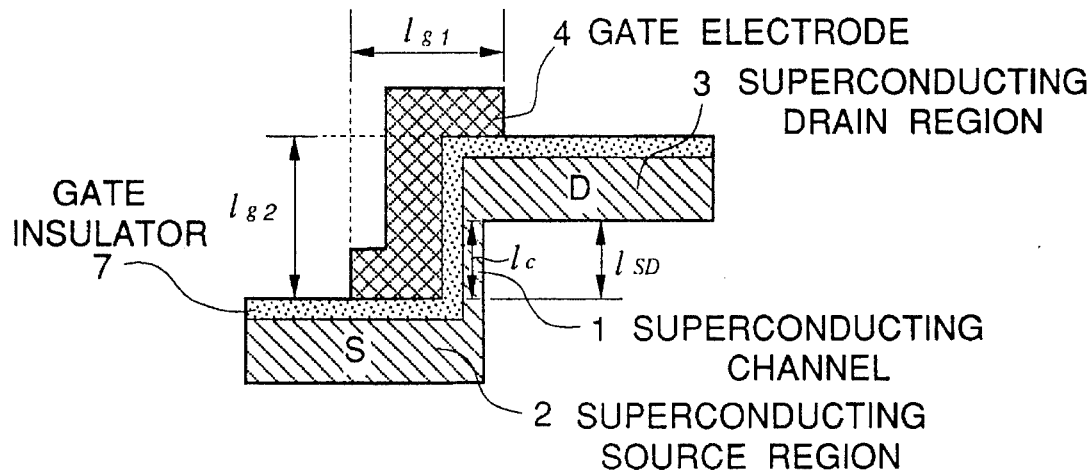
FIG. 8 shows a diagrammatic sectional view of a eighth embodiment of a super-FET according to the present invention, in which the length of the gate electrode is the sum of $l_{g1}$ and $l_{g2}$, which is longer than the length $l_{SD}$ and not longer than one and one half the length $l_{SD}$.
Figure 9:
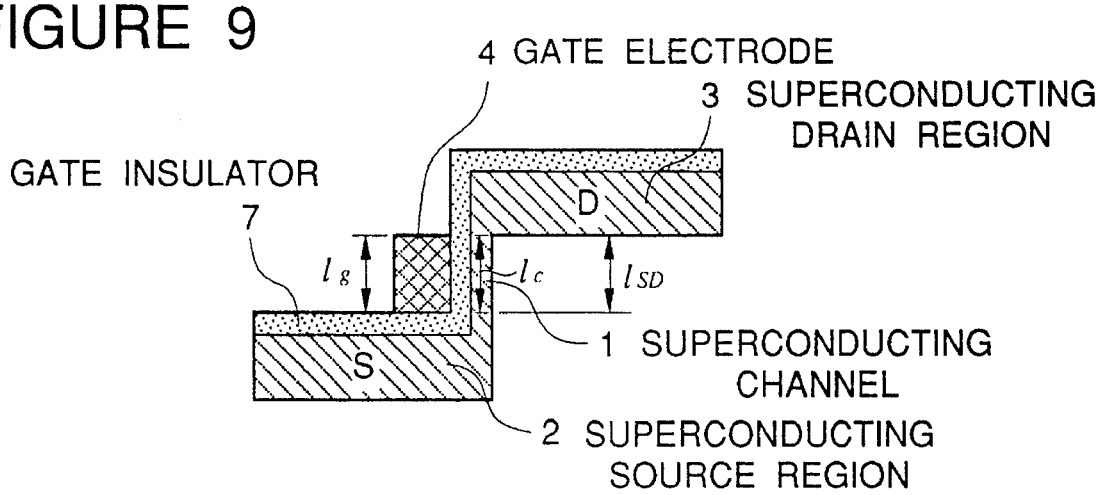
FIG. 9 shows a diagrammatic sectional view of a ninth embodiment of a super-FET according to the present invention, in which the length of the gate electrode $l_g$ is not shorter than one half the length $l_{SD}$.

FIGS. 8 and 9 show variations of the super-FET of this embodiment. The super-FET shown in FIG. 8 has a crank-shaped gate electrode 4 of which length $l_g$ is the sum of $l_{g1}$ and $l_{g2}$ and which is longer than the length $l_{SD}$ and not longer than one and a half of the length $l_{SD}$. This longer gate electrode is further favorable for the large modulation of large modulation of both current and voltage of the superconducting channel and complete ON/OFF operation Of the superconducting channel.

The gate electrode has a longer length of $l_g$ than the length $l_c$ of the superconducting channel and a length $l_{SD}$ of a portion having an equal thickness to that of the superconducting channel between the superconducting source region and the superconducting drain region. Therefore, the resistance of the superconducting channel is changed along its whole length, when a voltage is applied to the gate electrode. By this, large modulation of both current and voltage of the superconducting channel and complete ON/OFF operation of the superconducting channel are realized.

The length $l_{SD}$ of the portion having an equal thickness to that of the superconducting channel between the superconducting source region and the superconducting drain region preferably ranges from 100 to 1000 nanometers. The length $l_{SD}$ is determined by fine processing capability and epitaxial growth ability between the superconducting source region and the superconducting drain region. As mentioned above, the gate electrode is longer than the length $l_{SD}$. The length $l_g$ of the gate electrode preferably ranges from 100 to 1500 nanometers and not longer than one and a half length of the length $l_{SD}$. In this case, the length $l_{SD}$ between the superconducting source region and the superconducting drain region is the same as the length $l_c$ of the superconducting channel.

The super-FET shown in FIG. 9 has a short gate electrode 4 of which length is $l_g$ which is not shorter a half of the length $l_{SD}$. This shorter gate electrode is favorable for rapid operation of the super-FET.

The length $l_{SD}$ of the same thickness portion as the superconducting channel preferably ranges from 100 to 1000 nanometers. As mentioned above, the gate electrode is as long as the length $l_{SD}$ between the superconducting source region and the superconducting drain region is the same as the length $l_c$ of the superconducting channel.

The above super-FETs can be manufactured by the following process. At first, an oxide superconductor thin film of, for example $Y_1Ba_2Cu_3O_{7-x}$ is deposited on a substrate 5 such as a $SrTiO_3$ (100) substrate including a step having a height of a few hundreds nanometers by a deposition process of high anisotropy such as MBE or reactive co-evaporation. Thickness of portions of the oxide superconductor thin film on a horizontal surface of the substrate 5 should be enough large to form a contact on its surface such as 300 nanometers. These portions become a superconducting source region 2 and a superconducting drain region 3.

Thickness of a portion of the oxide superconductor thin film on a vertical surface of the substrate 5 should be extremely thin such as 5 nanometers so as to form a superconducting region 1.

Then, a gate insulating layer 7 of, for example $SrTiO_3$, MgO or silicon nitride is formed on the oxide superconductor thin film by an isotropic deposition process such as sputtering or vacuum evaporation. Thereafter, a gate electrode 4 is formed by depositing a noble metal layer such as Au layer on the gate insulating layer 7 by an isotropic deposition process such as sputtering or vacuum evaporation and etching the noble metal layer by anisotropic etching process such as reactive ion etching, so that the super-FET in accordance with the present invention is completed.

The invention has thus been shown and described with reference to the specific embodiments. However, it should be noted that the present invention is in no way limited to the details of the illustrated structures but converts and modifications may be made within the scope of the appended claims.

We claim:

1. A superconducting FET device comprising a superconducting source region and a superconducting drain region separately formed of an oxide superconductor and connected by a thin superconducting portion formed of the oxide superconductor that is thin enough to ensure a complete ON/OFF operation, so that superconducting current can flow through the thin superconducting portion between the superconducting source region and the superconducting drain region, and a gate electrode positioned on a gate insulator on the thin superconducting portion for controlling superconducting current flowing through the thin superconducting portion, wherein the superconducting source region, the thin superconducting region and the superconducting drain region are arranged in a crank-shaped configuration in which the superconducting source and drain regions are on different levels with the thin superconducting portion vertically arranged between an end of the superconducting source region and an end of the superconducting drain region, and wherein a part of the thin superconducting portion constitutes a superconducting channel, a length of the gate electrode along the direction in which the superconducting current flows ranging from one half of a length of the thin superconducting portion having a thickness the same as the superconducting channel to one and a half length of the thin superconducting portion having a thickness the same as the superconducting channel.

2. A superconducting FET device as claimed in claim 1, wherein the length of the gate electrode is in excess of that of the thin superconducting portion.

3. A superconducting FET device as claimed in claim 1, wherein a whole length of the gate electrode is almost the same as the length of the thin superconducting portion.

4. A superconducting FET device as claimed in claim 1, wherein a whole length of the gate electrode is shorter than the length of the thin superconducting portion.

5. A superconducting FET device as claimed in claim 1, wherein the superconductor FET device is arranged on a substrate selected from the group consisting of a MgO (100) substrate, a $SrTiO_3$ (100) substrate and a $CdNdAlO_4$ (001) substrate, and a semiconductor substrate.

6. A superconducting FET device as claimed in claim 1, wherein the oxide superconductor is formed of high-$T_c$ oxide superconductor.

7. A superconducting FET device claimed in claim 5, wherein the substrate is formed of a silicon substrate and a principal surface of the silicon substrate is coated with an insulating material layer which is formed of a $MgAl_2O_4$ layer and a $BaTiO_3$ layer.

8. A superconducting FET device as claimed in claim 6, wherein the oxide superconductor is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

9. A superconducting FET device as claimed in claim 6, wherein the high-$T_c$ oxide superconductor is a high-$T_c$ copper-oxide type compound oxide superconductor.

* * * * *

UNITED STATES PATENT AND TRADEMARK OFFICE
CERTIFICATE OF CORRECTION

PATENT NO. : 5,552,374
DATED : September 3, 1996
INVENTOR(S) : Tanaka et al.

It is certified that error appears in the above-indentified patent and that said Letters Patent is hereby corrected as shown below:

Please note that on the cover sheet, Column 1, Section "[63]" contains a typographical error wherein "Apr. 19, 1993" should read --Apr. 9, 1993--.

Signed and Sealed this

Twenty-second Day of April, 1997

Attest:

BRUCE LEHMAN

*Commissioner of Patents and Trademarks*

*Attesting Officer*